United States Patent [19]

Nakai

[11] Patent Number: 5,105,628
[45] Date of Patent: Apr. 21, 1992

[54] METHOD OF STORING SEMICONDUCTOR SUBSTRATE

[75] Inventor: Ryusuke Nakai, Hyogo, Japan

[73] Assignee: Sumitomo Electric Industries, Ltd., Osaka, Japan

[21] Appl. No.: 455,332

[22] PCT Filed: Apr. 25, 1988

[86] PCT No.: PCT/JP88/00404
§ 371 Date: Dec. 27, 1989
§ 102(e) Date: Dec. 27, 1989

[87] PCT Pub. No.: WO89/00334
PCT Pub. Date: Jan. 12, 1989

[30] Foreign Application Priority Data

Jul. 8, 1987 [JP] Japan .................... 62-170440

[51] Int. Cl.$^5$ .................................. F24F 3/16
[52] U.S. Cl. ........................... 62/78; 62/259.2
[58] Field of Search ............ 62/51.1, 78, 259.2; 250/352

[56] References Cited

U.S. PATENT DOCUMENTS 4,739,633  4/1988  Faris .................... 62/51.1

FOREIGN PATENT DOCUMENTS 60-43823  3/1985  Japan .
61-46970 10/1986  Japan .

Primary Examiner—Ronald C. Capossela
Attorney, Agent, or Firm—W. G. Fasse; D. H. Kane, Jr.

[57] ABSTRACT

A method for storing a semiconductor substrate preserves the semiconductor substrate at a temperature not more than 10° C. in a sealed manner. After the surface of the semiconductor substrate has been cleaned by etching or the like, the semiconductor substrate is put in a bag of a synthetic resin sheet. An inert gas is introduced into the bag or the bag is brought into a vacuum state, the bag is sealed, and then maintained at the above temperature, whereby the cleaned surface is not recontaminated for a prolonged period of time.

4 Claims, 2 Drawing Sheets

METHOD OF STORING SEMICONDUCTOR SUBSTRATE

FIELD OF THE INVENTION

The present invention relates to a method of storing a wafer which is a semiconductor substrate.

BACKGROUND INFORMATION

In general, a method of sealing a wafer in an atmosphere of dry nitrogen gas or the like is employed for storing and transporting a semiconductor wafer. This storage method is carried out immediately after the wafer has been polished to form a mirror surface, or immediately after a distorted layer, a contaminated layer and the like are removed by an etching solution.

However, although bedewing and oxidation can be prevented to some extent by such a conventional method, a progression in the deterioration of the wafer surface caused by a residual polishing solution or by a residual etchant and a change in the surface stoichiometry caused by a difference in the vapor pressures or reactivities, which causes a problem in a semiconductor material of two or more elements such as GaAs, cannot be avoided.

Although any residual etchant or the like is removed by washing, the same still remains on the wafer surface in a thickness of about 1 atom by physical adsorption or chemical bond. Such a layer of the residual etchant or the like is so extremely thin that the same evaporates by an increase in temperature when of an epitaxial layer etc. is formed on the cleaned surface. No problem is caused when the residual etchant or the like is removed during the process of forming a device. However, the aforementioned evaporation is prevented if the residual etchant or the like has time to react with the surface of the semiconductor wafer to newly form a compound, leading to roughening of the surface.

In order to prevent such roughening of the surface, the wafer is generally treated by etching or the like immediately before the process of forming the epitaxial layer, etc. The steps of forming the device are complicated by such treatment, and hence the merit of improving the productive efficiency by high-volume processing cannot be achieved by conventional methods.

SUMMARY OF THE INVENTION

An object of the present invention is to provide a method of storing a semiconductor substrate, which can suppress a reaction between a residual etchant or the like and the surface of a semiconductor wafer to avoid the need for a repeated cleaning, e.g. etching etc. performed as a pretreatment prior to forming an operating layer on the substrate.

The feature of the present storage method resides in that a semiconductor substrate is preserved at a temperature not more than 10° C., preferably a temperature not more than 5° C. More preferably, the semiconductor substrate is preserved at a temperature not more than −20° C.

Further, the semiconductor substrate is preferably sealed in an atmosphere of a dry inactive gas or in a vacuum state, to be preserved. Such sealing is preferably implemented by covering the semiconductor substrate with a member such as a synthetic resin sheet or a layer structure of a metal foil sandwiched between resin sheets, which is not permeable to gas, water and alcohol molecules.

The semiconductor substrate to be stored by the method of the present invention is in a state not yet provided with an operating layer on its surface for forming a device, or in a state between a step and a subsequent step in the process of forming a device.

Since both, the reaction with a residual etchant etc. and the change in stoichiometry of the surface are chemical reactions, the reaction velocity V thereof is in accordance with the following Arrhenius equation.

$$V = V_0 \exp\left(-\frac{E}{kT}\right)$$

where k represents Boltzmann's constant, T represents absolute temperature (K) and E represents reaction energy.

FIG. 2 illustrates the relationship between a relative reaction velocity and the temperature with changes in the reaction energy as parameters according to the Arrhenius' equation. The horizontal line shows the temperature and the vertical line shows relative reaction velocity, expressed as a reaction velocity at 300 K.

The reaction energy in a general chemical reaction is about 1 to 2 eV. Therefore, when cooling is performed to 10° C. in the case of a general chemical reaction, the relative reaction velocity, expressed as the reaction velocity at the ordinary temperature of 300° K., is lowered to ⅓ to 1/10, and further lowered to a substantially negligible level when cooling is performed to −20° C.

In the case of an extremely weak interaction such as physical adsorption, the reaction energy is about 0.1 eV. In the case of such low reaction energy, the reaction velocity can also be substantially halved by cooling to −20° C.

As hereinabove described, the semiconductor substrate to be cooled and preserved according to the present invention is preferably in an atmosphere of a dry gas. If the same is cooled in a gas containing a large amount of vapor of some liquid such as water or alcohol, bedewing or frosting is caused on the surface of the wafer.

Further, since the problem of bedewing etc. is also caused when the substrate is returned from a low temperature to the ordinary temperature, wafers are preferably independently sealed in a dry gas for every batch. Thus, it is recommended that the wafers are sealed in a bag which is not permeable to gas, water and alcohol molecules. The gas atmosphere is preferably prepared by using an inert gas such as nitrogen or argon.

The cooling step is also adapted to prevent outgassing from a bag, a tray or the like.

According to the present storage method, a clean surface obtained immediately after polishing or etching a semiconductor substrate can be maintained at least for one month.

In general, even such a clean surface has been decomposed by the lapse of time, and hence a treatment such as again etching or re-polishing has been performed on the substrate surface before manufacturing a device. The steps of manufacturing a device are made substantially more complicated by the need for such treatment. Besides, the additional treatment may cause scratches or dust may stick to the substrate surface.

According to the present invention, a clean surface can be maintained for at least one month to enable mass production, whereby the manufacturing cost can be reduced and the manufacturing steps can be simplified. Further, the present invention improves the product quality, since the products can be regularly obtained with a constant quality.

DETAILED DESCRIPTION: BEST MODE OF CARRYING OUT THE INVENTION

A semi-insulating GaAs wafer doped with Cr was etched by an etchant obtained by mixing $H_2SO_4$, $H_2O_2$ and $H_2O$ in the ratio 3:1:1 at a temperature of 80° C. for one minute.

Figure 1:
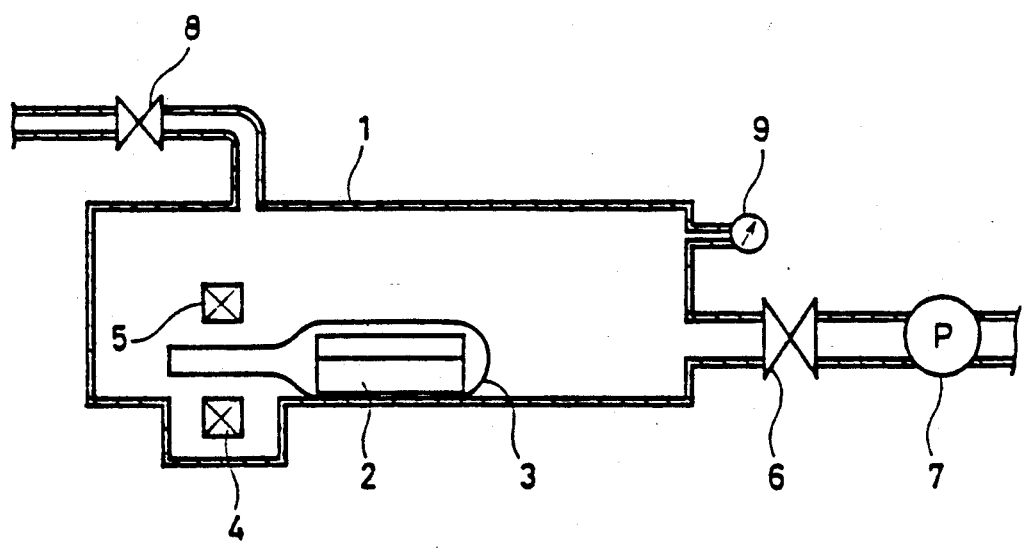
FIG. 1 shows an apparatus for illustrating an embodiment of the present invention.
Figure 2:
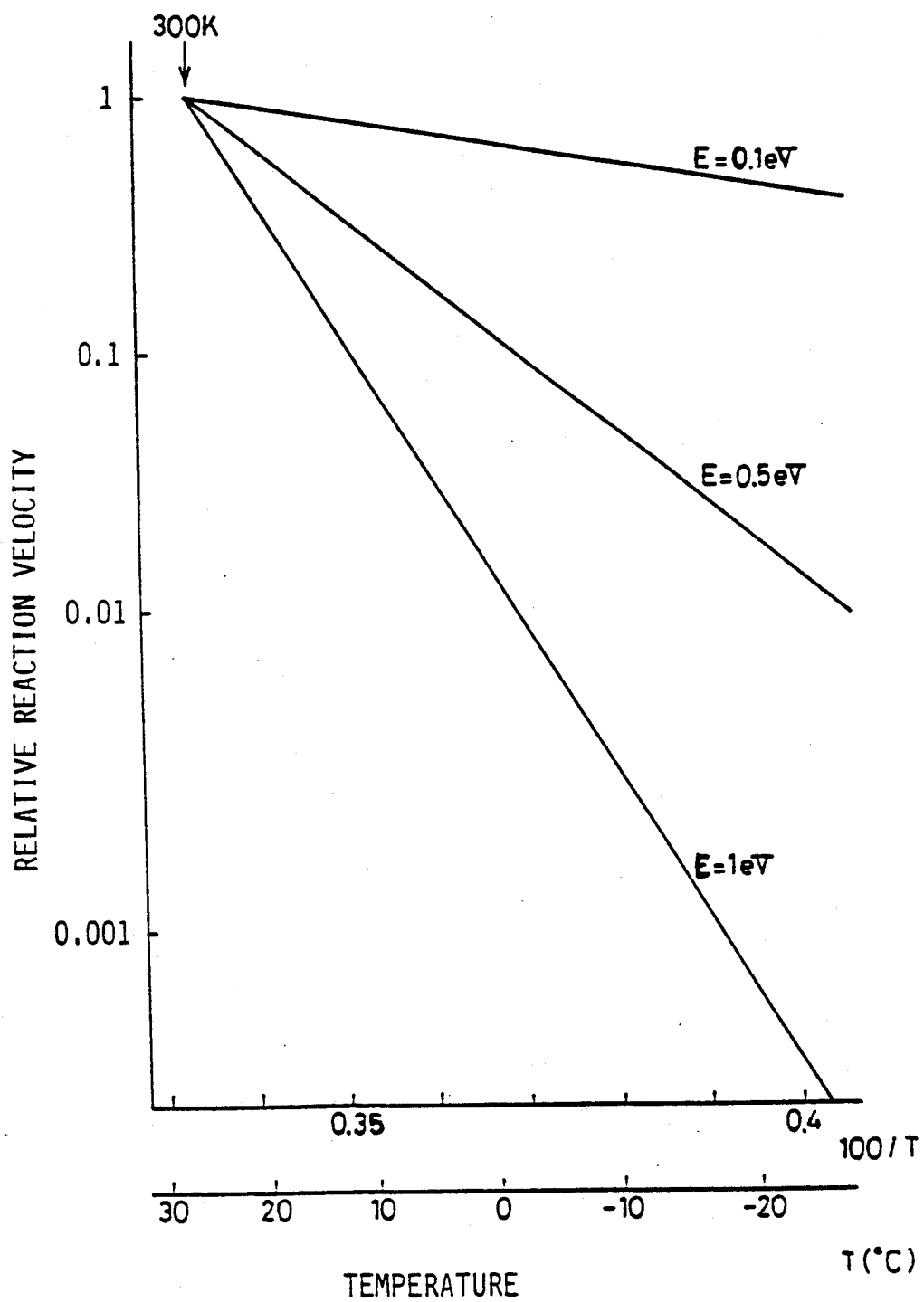
FIG. 2 shows the relationship between the relative reaction velocity and the temperature with changes in the reaction energy as parameters in accordance with the Arrhenius' equation.

The wafer thus etched was washed by flowing water and dried by a spinner to be put in a wafer tray of polypropylene, while nitrogen gas was charged by an apparatus as shown in FIG. 1. Referring to FIG. 1, a wafer tray 2 contained in a bag 3 of a synthetic resin sheet is placed in a vacuum chamber 1. The synthetic resin sheet forming the bag 3 is made of polyethylene in the form of a layer structure sandwiching an aluminum foil between resin sheets.

An end of the bag 3 is closed and the other end is initially open. Heaters 4 and 5 for sealing the bag 3 are provided above and under the open end of the bag 3. The vacuum chamber 1 is connected with a nitrogen gas container through a nitrogen valve 8 and as with a vacuum pump 7 through a vacuum valve 6. A vacuum gauge 9 is also mounted to measure the degree of vacuum in the vacuum chamber 1.

In order to preserve a semiconductor substrate according to the present invention, the wafer tray 2 is first put in the bag 3 as shown in FIG. 1 and the vacuum valve 6 is opened to operate the vacuum pump 7, thereby to decompress or evacuate the vacuum chamber 1 to be at a reduced pressure of not more than 1 Torr. Then the vacuum valve 6 is closed and the nitrogen valve 8 is opened to introduce dry nitrogen gas of high purity into the vacuum chamber 1 to a pressure of up to 500 Torr. This pressure is lower than the atmospheric pressure (760 Torr.) so that the bag is appropriately contracted to fix the wafer tray.

Then the heaters 4 and 5 are energized and the upper heater 5 is pressed against the lower heater 4, to seal the end portion of the bag 3 by heating. At this time, the heaters 4 and 5 are energized an electromagnetic cylinder without opening the vacuum chamber 1.

Then the vacuum chamber 1 is restored to the atmospheric pressure level and the vacuum chamber 1 is opened to take out the sealed bag 3.

Groups of ten wafers or substrate packed and sealed in the aforementioned manner were preserved at 5° C. and −20° C. respectively and taken out after 30 days, to cause VPE crystal growth by a chloride method.

Wafers or substrates preserved at 5° C. included three nondefective epitaxial layers and seven defective ones. Six such defectives were caused by roughening of the surfaces, and one was caused by a protrusion.

Wafers or substrates preserved at −20° C. included eight nondefective epitaxial layers and two defective ones. The defective layers were caused by protrusion in both cases.

For the purpose of comparison, ten wafers packed and sealed in a similar manner to the above, were preserved under the ordinary temperature and taken out after 30 days, to cause VPE crystal growth by the chloride method. All of ten epitaxial layers thus formed were defective. All of such defects were caused by roughening of the surfaces.

According to the present invention, the surface of a semiconductor substrate can be maintained clean for a long term, as hereinabove described. Thus, the present invention can be widely applied to the storage of general semiconductor substrates such as a compound semiconductor substrate of GaAs.

I claim:

1. A method of storing a semiconductor substrate comprising the following steps: cleaning at least one surface of said semiconductor substrate, sealing said semiconductor substrate with its cleaned surface in a dry atmosphere that will prevent renewed contamination of said cleaned surface, cooling said sealed semiconductor substrate to a temperature of not more than +5° C., and preserving said semiconductor substrate at said temperature of not more than +5° C. to restrain any chemical reaction prior to applying a further manufacturing step on said cleaned surface of said semiconductor substrate at a later time, whereby repeated cleaning of said surface is avoided.

2. The method of claim 1, wherein said dry atmosphere is a dry inert gas.

3. The method of claim 1, wherein said dry atmosphere is a vacuum state.

4. The method of claim 1, wherein said cooling step is performed to bring said semiconductor substrate to a temperature within the range of −20° C. to not more than +5° C.

* * * * *